United States Patent
De Samber et al.

(10) Patent No.: US 10,084,110 B2
(45) Date of Patent: Sep. 25, 2018

(54) LOW WARPAGE WAFER BONDING THROUGH USE OF SLOTTED SUBSTRATES

(71) Applicant: KONINKLIJKE PHILIPS N.V., Eindhoven (NL)

(72) Inventors: Marc Andre De Samber, Someren (NL); Eric Cornelis Egbertus Van Grunsven, Horst (NL); Roy Antoin Bastiaan Engelen, Linburg (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 15/438,592

(22) Filed: Feb. 21, 2017

(65) Prior Publication Data

US 2017/0200853 A1    Jul. 13, 2017

Related U.S. Application Data

(63) Continuation of application No. 14/352,698, filed as application No. PCT/IB2012/055357 on Oct. 5, 2012, now Pat. No. 9,583,676.

(Continued)

(51) Int. Cl.
*H01L 33/00* (2010.01)
*H01L 23/00* (2006.01)
(Continued)

(52) U.S. Cl.
CPC ...... *H01L 33/0079* (2013.01); *H01L 25/0753* (2013.01); *H01L 33/0054* (2013.01);
(Continued)

(58) Field of Classification Search
CPC .......... H01L 33/00; H01L 33/12; H01L 33/24
(Continued)

(56) References Cited

U.S. PATENT DOCUMENTS

| 5,946,022 A | 8/1999 | Kamimura |
|---|---|---|
| 7,393,758 B2 | 7/2008 | Sridhar et al. |

(Continued)

FOREIGN PATENT DOCUMENTS

| CN | 1119788 A | 4/1996 |
|---|---|---|
| CN | 1787168 A | 6/2006 |

(Continued)

OTHER PUBLICATIONS

EPO as ISA, PCT/IB2012/055357 filed Oct. 5, 2012, "International Search Report and Written Opinion", dated Jan. 21, 2013, 12 pages.

(Continued)

*Primary Examiner* — Duy T Nguyen
*Assistant Examiner* — Brian Turner

(57) ABSTRACT

In a wafer bonding process, one or both of two wafer substrates are scored prior to bonding. By creating slots in the substrate, the wafer's characteristics during bonding are similar to that of a thinner wafer, thereby reducing potential warpage due to differences in CTE characteristics associated with each of the wafers. Preferably, the slots are created consistent with the singulation/dicing pattern, so that the slots will not be present in the singulated packages, thereby retaining the structural characteristics of the full-thickness substrates.

12 Claims, 2 Drawing Sheets

Related U.S. Application Data

(60) Provisional application No. 61/549,772, filed on Oct. 21, 2011.

(51) Int. Cl.
| | |
|---|---|
| *H01L 33/12* | (2010.01) |
| *H01L 21/768* | (2006.01) |
| *H01L 29/06* | (2006.01) |
| *H01L 33/62* | (2010.01) |
| *H01L 33/48* | (2010.01) |
| *H01L 25/075* | (2006.01) |

(52) U.S. Cl.
CPC ............ *H01L 33/486* (2013.01); *H01L 33/62* (2013.01); *H01L 2933/0066* (2013.01)

(58) Field of Classification Search
USPC ................. 257/79, 99, 622; 438/22, 28, 107
See application file for complete search history.

(56) References Cited

U.S. PATENT DOCUMENTS

| | | |
|---|---|---|
| 2004/0102030 A1 | 5/2004 | Narita |
| 2004/0115868 A1 | 6/2004 | Ono |
| 2004/0221451 A1* | 11/2004 | Chia ................... H01L 21/6835 29/854 |
| 2006/0043822 A1 | 3/2006 | Yokota |
| 2006/0065976 A1* | 3/2006 | Hsuan ..................... H01L 23/15 257/734 |
| 2007/0188047 A1 | 8/2007 | Tanaka |
| 2008/0217761 A1 | 9/2008 | Yang et al. |
| 2009/0057690 A1* | 3/2009 | Chakraborty ........... H01L 33/44 257/88 |
| 2009/0179207 A1* | 7/2009 | Chitnis .................. H01L 33/44 257/88 |
| 2009/0267083 A1 | 10/2009 | Cui |
| 2009/0315965 A1 | 12/2009 | Yamagata |
| 2009/0323334 A1 | 12/2009 | Roberts |
| 2010/0109035 A1 | 5/2010 | Cho et al. |
| 2010/0171134 A1 | 7/2010 | Shao et al. |
| 2010/0308455 A1 | 12/2010 | Kim |
| 2010/0314627 A1 | 12/2010 | Sung |
| 2011/0035915 A1 | 2/2011 | Ryu et al. |
| 2011/0127567 A1* | 6/2011 | Seong .................. H01L 33/0079 257/99 |
| 2012/0073131 A1* | 3/2012 | Miyazawa .......... H01L 21/4853 29/846 |
| 2012/0286301 A1* | 11/2012 | Kobayakawa ........ H01L 29/866 257/88 |
| 2013/0026525 A1* | 1/2013 | Chen ....................... H01L 33/62 257/98 |

FOREIGN PATENT DOCUMENTS

| | | |
|---|---|---|
| JP | S5852846 A | 3/1983 |
| JP | H08236615 A | 9/1996 |
| JP | 2007-158133 | 6/2007 |
| JP | 200971251 A | 4/2009 |
| JP | 2012-129440 | 7/2012 |
| TW | 200411955 A | 11/2005 |
| WO | WO-2010102686 | 9/2010 |
| WO | 2013057617 A1 | 4/2013 |

OTHER PUBLICATIONS

First Office Action, China Application No. 201280051691.7, dated Dec. 25, 2015, 21 pages.
Notice of Reasons for Rejection dated Sep. 6, 2016 from Japanese Patent Application No. 2014-536361, 9 pages.
Office Action, Taiwan Application No. 101138781, dated Feb. 23, 2016, 8 pages.
Second Office Action from Chinese Patent Application No. 201280051691.7 dated Aug. 26, 2016, 3 pages.
Third Office Action dated Mar. 2, 2017, China Patent Application No. 201280051691.7, 17 pages.
Marc de Samber, et al., U.S. Appl. No. 61/521,783 filed Aug. 10, 2011, "Wafer Level Processing of LEDS Using Carrier Wafer", 16 pages.
Notice of Reason for Rejection dated Dec. 6, 2016, Japan Patent Application No. 2014-536361, 4 pages.
Fourth Office Action dated Aug. 7, 2017, China Patent Application No. 201280051691.7, 15 pages.
Article 94(3) EPC dated Dec. 19, 2017, European Application No. 12798371.6, 4 pages.

* cited by examiner

LOW WARPAGE WAFER BONDING THROUGH USE OF SLOTTED SUBSTRATES

CROSS-REFERENCE TO RELATED APPLICATIONS

The present application is a continuation of U.S. patent application Ser. No. 14/352,698, filed on Apr. 18, 2014, titled "LOW WARPAGE WAFER BONDING THROUGH USE OF SLOTTED SUBSTRATES", issuing as U.S. Pat. No. 9,583,676 on Feb. 28, 2017, which is a § 371 application of International Application No. PCT/IB2012/055357 filed on Oct. 5, 2012, which claims priority to U.S. Provisional Patent Application No. 61/549,772, filed Oct. 21, 2011. U.S. patent application Ser. No. 14/352,698, International Application No. PCT/IB2012/055357, and U.S. Provisional Patent Application No. 61/549,772 are incorporated herein.

FIELD OF THE INVENTION

This invention relates to the field of semiconductor fabrication, and in particular to wafer-scale bonding.

BACKGROUND OF THE INVENTION

Wafer bonding is becoming increasingly popular for coupling elements on different wafers before singulation (dicing). A wafer of 4"-8" diameter may contain hundreds or thousands of devices, and the bonding of two wafers can replace the conventional bonding of each of these hundreds or thousands of devices individually.

In the conventional fabrication of light emitting devices (LEDs), for example, a wafer containing the semiconductor devices is diced, and the individual devices are subsequently bonded to a submount that provides structural support and means for coupling to external power sources or other circuitry. Generally, the submount is sized to facilitate subsequent manufacturing processes, such as mounting on a printed circuit board, or placement in a fixture. If the size of the LED is substantially smaller than the size of the submount, this process is fairly efficient.

However, particularly in the field of LEDs, the size of the individual device (chip) has been increasing, due, for example, to an increase in the area of the light emitting element, or for the inclusion of multiple light emitting elements in a single device. Accordingly, chip-scale packaging, wherein the overall size of the packaged (mounted) device is not significantly larger than the chip, is becoming quite common. In such cases, wherein the size of the chip is similar to the size of the submount, bonding a wafer of LEDs to a wafer of submounts may provide for a very efficient manufacturing process.

Often, the materials used for the different wafers are of different materials, the material of one wafer being chosen to facilitate the fabrication of the semiconductor devices, and the material of the other wafer being chosen to facilitate structurally and electrically sound packaging. In the example of light emitting devices, the semiconductor wafer often contains a thick layer of GaN-based or GaP material, such as AlInGaN, AlInGaP, InGaN, etc., on a sapphire growth substrate, whereas the submount wafer may typically include one or more metal layers on a silicon substrate.

Because different materials are commonly used for forming semiconductors and forming submounts, the feasibility of wafer-bonding is subject to a number of challenges. Differences in the coefficient of thermal expansion (CTE) between the two wafers, or other layers of the combination, may lead to warpage after assembly, particularly when relatively high temperatures are used to affect the bonding. In addition to problems caused during the bonding process, the resultant warped packages will introduce problems in subsequent processes, such as processes used to remove layers, texture surfaces, and so on, and may result in reliability problems when these warped packages are mounted to printed circuit boards or other fixtures.

Conventionally, one method of reducing warpage is to assure that one of the bonded materials is substantially thinner than the other material, the thicker material enforcing a certain flatness. However, in the case of semiconductor packaging, the grown substrate and the submount substrate are typically of comparable thicknesses. The growth substrate must be thick enough to support the fabrication process, and the submount substrate must be thick enough to provide structural support to the finished package.

SUMMARY OF THE INVENTION

It would be advantageous to be able to bond wafers of different materials such that the potential for warpage is reduced. It would also be advantageous to be able to bond these wafers while still maintaining the structural integrity of the packaged devices.

To better address one or more of these concerns, in an embodiment of this invention, the submount wafer is scored prior to bonding with the semiconductor wafer. By creating slots in the submount wafer, the wafer's characteristics during bonding are similar to that of a thinner wafer. Preferably, the slots are created consistent with the dicing pattern, so that the slots will not be present in the singulated packages, thereby retaining the structural characteristics of the full-thickness submount wafer.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1:
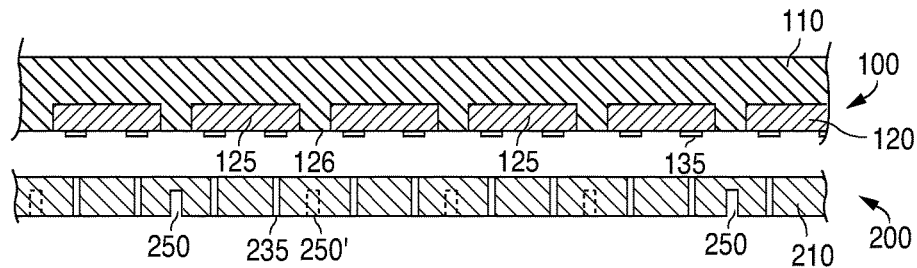
FIG. 1 illustrates an example bonding of two wafers.

FIG. 1 illustrates an example bonding of a first wafer 100 and a second wafer 200. The first wafer 100 may include a functional structure 120 formed on a substrate 110. The functional structure 120 may include, for example, a plurality of semiconductor devices 125 that are grown over a growth substrate 110. Within the field of semiconductor light emitting devices, for example, the devices 125 may comprise one or more light emitting elements formed by a series of n-type and p-type layers grown upon a sapphire substrate 110. Regions 126 may serve to separate or isolate the devices 125, and may provide features that facilitate the singulation/dicing of the wafer 100 into the individual devices 125.

As is known in the art, the light extraction efficiency may be improved by removing the sapphire substrate 110 and roughening the first grown layer, which is typically an n-type GaN layer); light is thereafter extracted from the roughened layer, which in FIG. 1 would be the uppermost layer of the structure 120. At the lowermost layer of the structure 120, a conductive layer may be formed, and patterned so as to provide pads, or contacts 135 that facilitate coupling each light emitting device 125 to external power sources.

Although the structure 120 may contain a number of fairly rigid layers, such as semiconductors, metals, and dielectrics, the structure 120, and in particular, the devices 125, may not have the structural integrity to allow the structure 120 or the devices 125 to be handled and/or subjected to subsequent manufacturing processes. Accordingly, before the substrate 110 is removed, the structure 120 may be mounted upon a different substrate, this different substrate providing the necessary structural integrity. Substrate 210 of the wafer 200 may provide this structural integrity, as well as providing for coupling the devices 125 to external power sources or other circuitry. The coupling may be provided by a portion of second wafer 200 that is used as a submount.

In an exemplary embodiment, the devices 125 the devices on first wafer 100 and the sections of second wafer 200 are laid out in a rectangular grid of device/submounts. Each device may be aligned with a single submount but other arrangements such as multiple devices on a single submount or a single device on multiple submounts are contemplated and included within the scope of the invention.

U.S. patent application 61/521,783, "WAFER LEVEL PROCESSING OF LEDS USING CARRIER WAFER", filed 10 Aug. 2011 for Marc de Samber and Eric van Grunsven, discloses the use of a submount wafer with through-holes (vias) that align with corresponding contact areas on LED structures on a growth substrate, and is incorporated by reference herein. After bonding the two wafers together, the combination is processed to allow conductors to be formed in these vias, these conductors thereby extending the contacts to the LED structures through the vias.

Although not limited to this example, the substrate 210 of the submount wafer 200 is silicon. The vias 235 are situated in the substrate 210 such that they are aligned with the contacts 135 that are electrically connected to the devices 125. After bonding the wafer 100 to the wafer 200, typically using an adhesive bonding layer, any residual bonding material is removed from the vias 235, and a conductive material, such as copper, is used to fill the vias 235 and form pads (not shown) on the lower surface of the substrate 210, to facilitate external connection(s) to the devices 125.

As noted above, after bonding the wafers 100, 200, the original growth layer 110 may be removed, and the uppermost layer of the grown structure 120 may be processed to facilitate efficient light extraction. These processes, as well as others, may be adversely affected by any warpage of the bonded wafers.

To reduce the potential warpage, while still providing structural support to the devices 125, the submount wafer may be scored with slots 250. Scoring the submount substrate 210 will reduce its overall rigidity, allowing it to flex, if necessary, to relieve some of the tensions that may result due to differences in the coefficient of thermal expansion (CTE) between the substrates 110, 210, or due to other processing effects.

As illustrated in FIG. 1, the slots 250 are preferably situated so that they do not lie beneath the devices 125 when the devices 125 are singulated. Accordingly, the slots 250 may be situated along the same lines as will be used for singulating the devices, typically directly below the boundary areas 126 between the devices 125. Thus, the slots may be aligned with the "grid" of device/submounts.

FIG. 1 illustrates slots 250 being spaced apart by four devices 125, although, as illustrated by the dashed potential slots 250', the slots 250 may be spaced closer together, or farther apart. The particular spacing, or pitch, will be selected based on a variety of factors, including the costs associated with making each slot, and the particular characteristics of the slots, as detailed in FIGS. 2-4.

Figure 2:
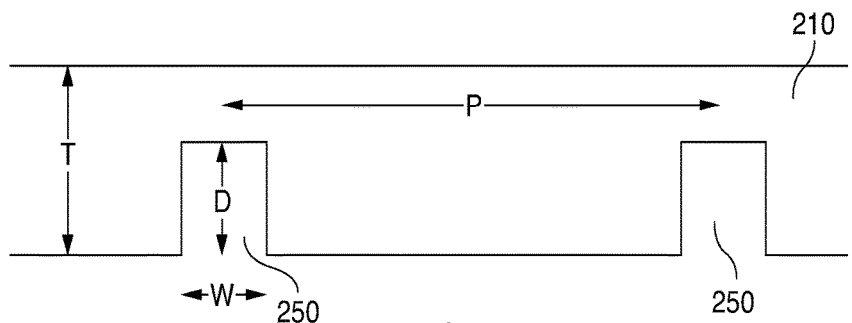
FIG. 2 illustrates an example scoring of a substrate.

FIG. 2 illustrates two slots 250 separated by a pitch P; typically, this pitch will be defined as the integer number of devices between the slots. The larger the pitch P, the fewer slots will be required for a given wafer size. Typically, the pitch P will be the same in both the horizontal and vertical directions relative to the grid of device/submounts, forming squares of devices, although such uniformity is not required. In like manner, a uniform pitch across the wafer is not required, and the slots may be oriented in one dimension only. For ease of reference and understanding, an equal pitch in both orientations is assumed for the analyses of FIGS. 3 and 4.

By slotting the substrate 210, the "effective thickness" of the substrate 210 is reduced from its original thickness T at the slot location. An "effective thickness" of the modified wafer is commonly defined as a thickness of an unmodified (unslotted) wafer that provides the same rigidity as the modified (slotted) wafer. Any of a variety of statistics, such as 'maximum' rigidity, or 'average' rigidity, may be used to define this equivalence.

Decreasing the pitch P decreases the effective thickness, because the 'stiffness' behavior of the slotted wafer is similar to that of a thinner wafer. In like manner, the effective thickness is also dependent upon the depth D of the slot, as well as its width W. Increasing either the depth D or the width W will decrease the effective thickness. In an example embodiment, the wafer thickness T may be 200 um, the depth D of the slot 150 um, and the width W of the slot 100 um. Typically, the depth D will range from 40-80% of the thickness T, and the width W will range from 5 to 20% of the width of the device.

Figure 3:
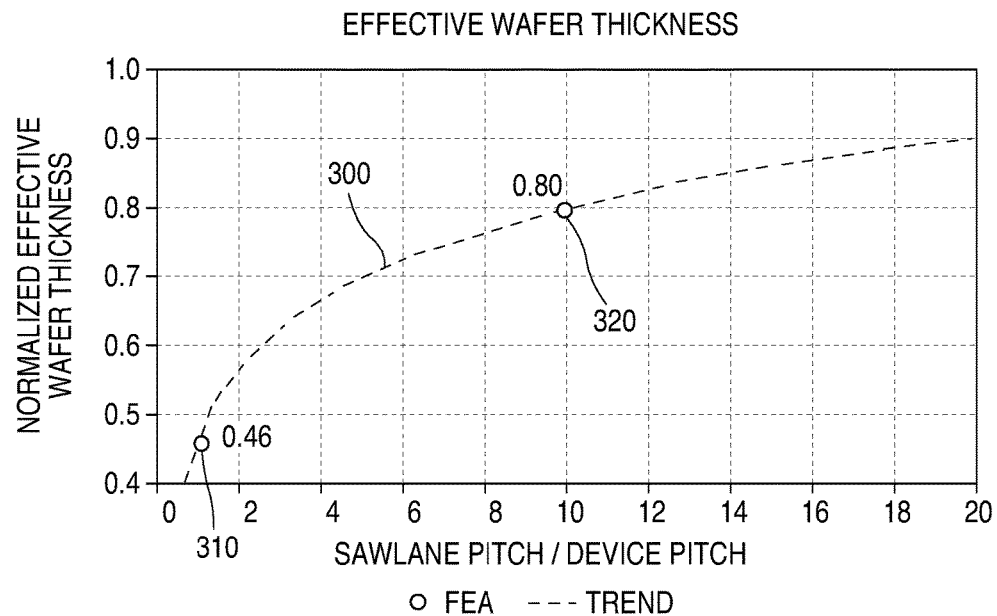
FIG. 3 illustrates an example plot of effective wafer thickness as a function of the scoring pitch.

Finite element analysis (FEA) is commonly used to assess the changes in material performance based on the shape and other characteristics of the material. FIG. 3 illustrates a graph 300 of the effective thickness of a silicon substrate 210 as a function of the pitch P of the slots, using the above slot dimensions (T=200 um, D=150 um, W=100 um), and an example device size of 1 mm×1 mm.

As illustrated in FIG. 3, if the pitch P of the slots is such that there is a slot between each device (pitch=1), the effective thickness 310 is less than half the actual wafer thickness T. If the pitch of the slots is such that there is a slot between every tenth device (pitch=10), the effective thickness 320 is about 80% of the actual wafer thickness. One of skill in the art will recognize that similar graphs of effective thickness may be generated as a function of each of the other slot and substrate dimensions.

Figure 4:
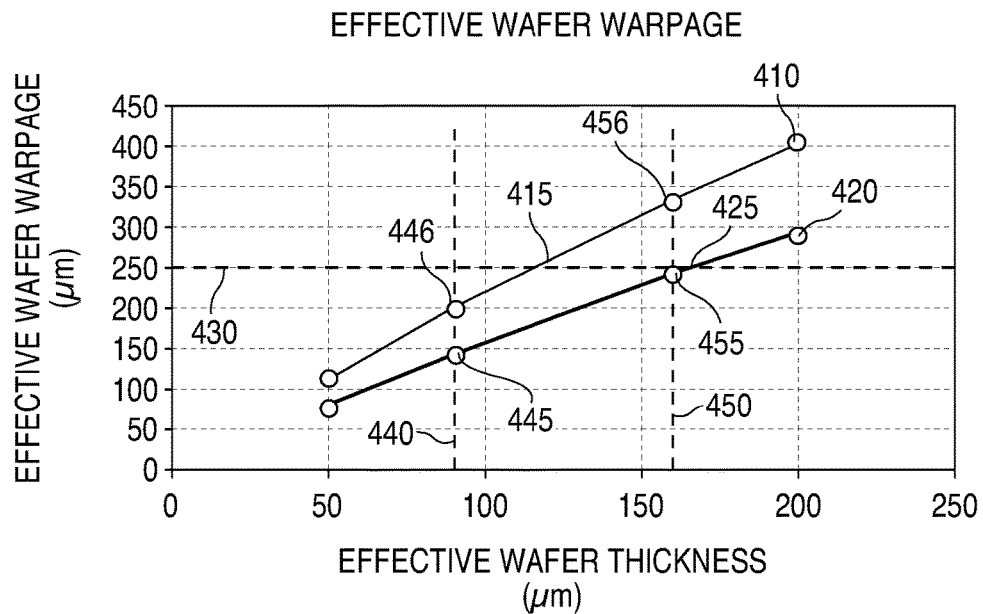
FIG. 4 illustrates an example plot of effective wafer warpage as a function of effective wafer thickness.

FIG. 4 illustrates a graph of the effective wafer warpage as a function of the effective waver thickness. The effective wafer warpage may be any statistic related to the wafer warpage, such as the maximum warpage, or the average warpage, that would occur in an unmodified (unslotted) wafer having a thickness equal to the effective wafer thickness.

The plots 410, 420 illustrate the effective warpage that may be experienced when the example 200 um silicon substrate 210 is bonded to the aforementioned sapphire substrate having a thickness of about 1.3 mm using bonding processes at two different temperatures. Plot 410 corresponds to an example use of a BCB (Benzocyclobuten) bond layer at 200° C., and plot 420 corresponds to an example use of an Epotek 377 bond layer at 150° C. Such plots may be used to determine a maximum effective submount thickness to achieve a given maximum wafer warpage, and vice versa.

For example, if the maximum wafer warpage in this example is 250 um, as indicated by the line 430 in FIG. 4, the effective thickness of the BCB-bonded silicon substrate cannot exceed about 125 um (415); and the effective thickness of an Epotek 377-bonded substrate 210 cannot exceed about 165 um (425).

Also illustrated in FIG. 4 are the vertical lines 440, 450 corresponding to the two pitches discussed above with respect to the example wafer of FIG. 3. Vertical line 440 corresponds to a pitch of one providing an effective thickness of about 90 um (45% of 200 um). If an Epotek 377-bonded substrate is used at this pitch, the effective wafer warpage will be about 150 um (445), which is below the aforementioned maximum wafer warpage of 250 um (430). In like manner, if a BCB-bonded substrate is used at this pitch, the effective wafer warpage will be about 200 um (446), which is also below the maximum wafer warpage of 250 um (430).

Vertical line 450, on the other hand, corresponds to a pitch of ten in the example wafer of FIG. 3, which provides an effective thickness of about 160 um (80% of 200 um). If an Epotek 377-bonded substrate (420) is used with this pitch, the effective warpage will be just under (455) the maximum wafer warpage of 250 um (430). However, the use of a pitch of ten on a BCB-bonded substrate (410) would result in an effective warpage of about 340 um (456), which exceeds the maximum limit of 250 um (430). Similar analyses can be applied for different pitches and different wafer substrates to ascertain that the selected wafer material and pitch satisfy the specified maximum effective wafer warpage.

Figure 5:
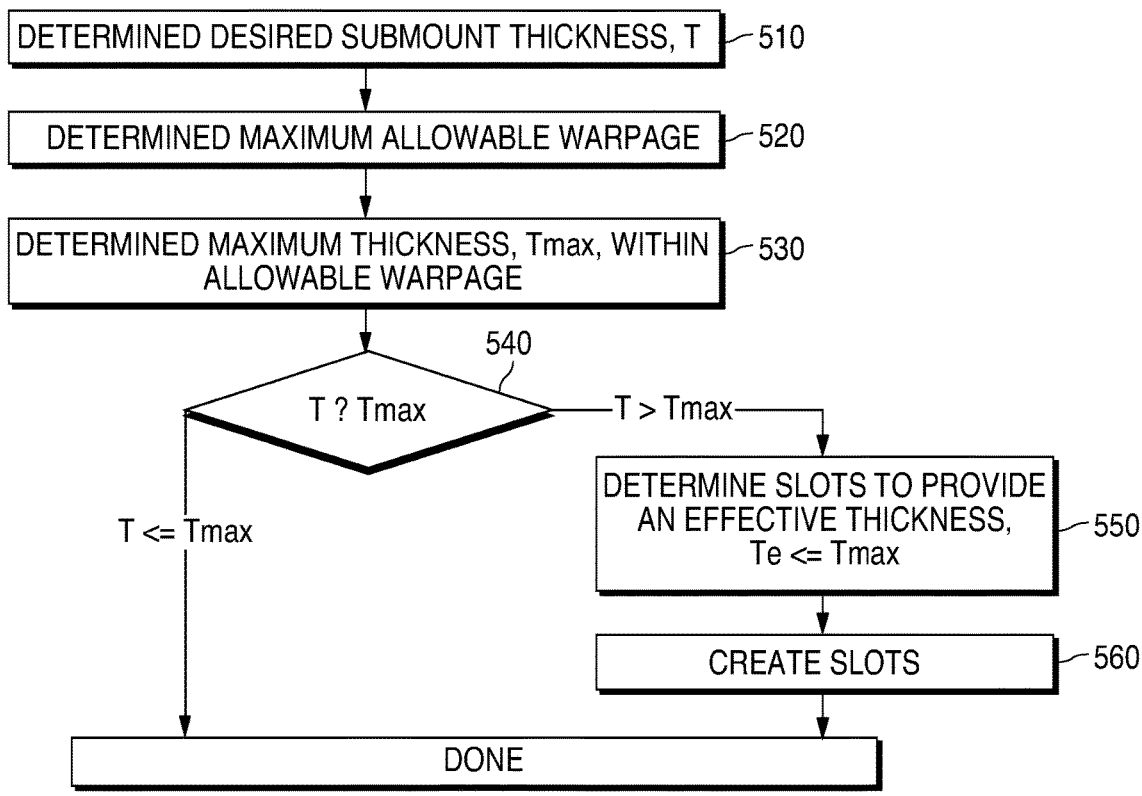
FIG. 5 illustrates an example flow diagram for determining parameters associated with the scoring of a wafer substrate.

An example flow diagram for determining preferred parameters for scoring a substrate is presented in FIG. 5.

With respect to FIGS. 1 and 2, it is significant to note that, because the slots 250 are located substantially at the boundaries of the devices 125, and do not occur within the region of the devices 125, the effective thickness of the substrate 210 with respect to each device 125 is not diminished, and remains at the original thickness T of the submount substrate 210. Accordingly, as illustrated in the example flow diagram of FIG. 5, in a typical embodiment of this invention, the thickness T of the submount substrate 210 of a given material is selected/determined, at 510, based on the structural support that is required to be provided to the device 125 during any of the fabrication and post-fabrication processes. Additionally, at 520, the maximum allowable warpage before singulation is also defined, typically based on the tolerances allowed for any of the individual fabrication processes.

Given these parameters (selected substrate material and thickness, maximum allowable warpage), as well as other parameters, such as the expected bonding temperature, the maximum effective thickness of the substrate can be determined, at 530, using, for example the plots 410, 420, 430 of FIG. 4. That is, if the maximum warpage is 250 um, and a BCB-bonded substrate is to be used, then the maximum effective warpage thickness is about 125 um (415); if an Epotek 377-bonded substrate is to be used, then the maximum effective warpage thickness is about 165 um (425).

If, at 540, the thickness T of the selected substrate 210 is below this maximum effective thickness, no slots are required in the substrate 210.

If, however, at 540, the given thickness T of the substrate 210 is greater than the maximum effective thickness, the effective thickness of the substrate 210 may be reduced by scoring. In such case, FEA or similar analyses may be performed, at 550, to determine an appropriate selection of pitch, depth, and width of slots that serve to reduce the effective thickness of the substrate 210 until it falls below the determined maximum effective thickness.

At 560 the slots are created in the substrate 210. As noted above, the selected pitch of the slots is preferably an integer multiple of the width of the device 125 along the given dimension, and the slots are aligned with the boundaries between the devices 125, thereby retaining the total thickness T of the substrate 210 supporting each of the devices 125.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein a formal analysis of the characteristics of the slots is not performed. Recognizing, for example, that adding slots facilitates or improves subsequent processes and/or the subsequent reliability of the packaged devices, one may add as many slots as can be afforded within the cost constraints associated with producing the devices. In like manner, a minimal cost option, such as "one slot in each dimension", may be set as a criterion for all bonded wafers, with additional slots being justified by additional analytic analysis.

Additionally, although the invention is presented in the context of scoring the substrate prior to bonding, one of skill in the art will recognize that the scoring may occur after bonding, but before some subsequent process that is likely to introduce warpage.

In like manner, although the invention is presented in the context of scoring the submount substrate, one of skill in the art will recognize that similar advantages may be achieved by scoring the growth substrate. An advantage of scoring the growth substrates is that, if the growth substrate is to be subsequently removed, the slots need not be aligned to the boundaries of the devices. One of skill in the art will also recognize that the scoring of both substrates may be used, for example, to achieve goals that are not feasibly achievable by the scoring of one substrate alone.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method comprising:
   providing a first wafer comprising a plurality of light emitting semiconductor devices grown on a growth substrate;
   providing a second wafer comprising a first surface, a second surface opposite the first surface, and a plurality of slots formed on the second surface, wherein the slots do not extend through an entire thickness of the second wafer;
   aligning the plurality of slots with boundaries between the light emitting semiconductor devices on the first wafer; and
   bonding the first surface of the second wafer to the first wafer.

2. The method of claim 1 further comprising after bonding the first surface of the second wafer to the first wafer, removing the growth substrate.

3. The method of claim 1 wherein the growth substrate is sapphire and the second wafer is silicon.

4. The method of claim 1 wherein the second wafer has a thickness T, and the slots have a depth D that is between forty and eighty percent of the thickness T.

5. The method of claim 1 wherein the light emitting semiconductor devices have a device width, and the slots have a slot width that is between five and twenty percent of the device width.

6. The method of claim 1 further comprising forming in the second wafer a plurality of through-holes aligned with contact areas on the light emitting semiconductor devices, the through-holes extending through the entire thickness of the second wafer.

7. The method of claim 1 wherein neighboring slots are disposed an integer number of light emitting semiconductor devices apart.

8. A method comprising:
   providing a first wafer comprising a plurality of light emitting semiconductor devices grown on a growth substrate;
   providing a second wafer comprising a first surface, a second surface opposite the first surface, and a plurality of slots that do not extend through an entire thickness of the second wafer formed on the second surface;
   bonding the first surface of the second wafer to the first wafer; and
   after bonding the first surface of the second wafer to the first wafer, removing the growth substrate.

9. The method of claim 8 wherein the growth substrate is sapphire and the second wafer is silicon.

10. The method of claim 8 further comprising forming in the second wafer a plurality of through-holes aligned with contact areas on the light emitting semiconductor devices, the through-holes extending through the entire thickness of the second wafer.

11. The method of claim 10 further comprising disposing conductors in the through-holes.

12. The method of claim 8 further comprising, after removing the growth substrate, dicing the first and the second wafers into individual light emitting semiconductor devices or groups of light emitting semiconductor devices.

* * * * *